United States Patent
Kodaira et al.

(10) Patent No.: US 7,292,475 B2
(45) Date of Patent: Nov. 6, 2007

(54) NONVOLATILE MEMORY DEVICE AND DATA WRITE METHOD FOR NONVOLATILE MEMORY DEVICE

(75) Inventors: Satoru Kodaira, Chino (JP); Hitoshi Kobayashi, Suwa (JP); Kimihiro Maemura, Suwa-Gunhara (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 11/176,324

(22) Filed: Jul. 8, 2005

(65) Prior Publication Data
US 2006/0023509 A1 Feb. 2, 2006

(30) Foreign Application Priority Data
Jul. 30, 2004 (JP) ............... 2004-224130

(51) Int. Cl.
*G11C 11/34* (2006.01)
*G11C 16/04* (2006.01)

(52) U.S. Cl. .............. 365/185.11; 365/185.14; 365/185.13; 365/185.23

(58) Field of Classification Search ........... 365/185.11, 365/185.12, 185.13, 185
See application file for complete search history.

(56) References Cited

U.S. PATENT DOCUMENTS

| | | | | |
|---|---|---|---|---|
| 4,527,256 A | * | 7/1985 | Giebel | 365/185.1 |
| 4,597,064 A | * | 6/1986 | Giebel | 365/185.13 |
| 5,022,001 A | * | 6/1991 | Kowalski et al. | 365/185.25 |
| 5,099,451 A | * | 3/1992 | Sourgen et al. | 365/185.2 |
| 5,471,422 A | | 11/1995 | Chang et al. | |
| 5,592,001 A | * | 1/1997 | Asano | 257/316 |
| 5,914,514 A | | 6/1999 | Dejenfelt et al. | |
| 6,044,017 A | | 3/2000 | Lee et al. | |
| 6,643,174 B2 | * | 11/2003 | Hoang | 365/185.11 |

FOREIGN PATENT DOCUMENTS

JP    A 08-222649    8/1996

OTHER PUBLICATIONS

Yaron, et al. A 16H E2PROM Employing new array architecture and designed-in reliability features, Oct. 1982, IEEE Journal of Solid-State Circuits, vol. 17, issue 5, 833-840.*

Yatsuda, et al. Hi-MNOS II technoogy for a 64-kbit byte-eraseable 5-V-only EEPROM. Feb. 1985, IEEE Transactions of Electron Devices, vol. 32, Issue 2, 224-231.*

* cited by examiner

*Primary Examiner*—Amir Zarabian
*Assistant Examiner*—Michael Weinberg
(74) *Attorney, Agent, or Firm*—Oliff & Berridge, PLC

(57) ABSTRACT

A nonvolatile memory device, including a plurality of memory cell blocks, N memory cell blocks (N is an integer equal to or greater than 2) being arranged in a row direction, L memory cell blocks (L is an integer equal to or greater than 2) being arranged in a column direction, and each of the memory cell blocks including M memory cells (M is an integer equal to or greater than 2), a plurality of wordlines, a plurality of first control gate lines, a plurality of first control gate switches, a plurality of second control gate lines, and a plurality of bitlines.

8 Claims, 9 Drawing Sheets

1000

NONVOLATILE MEMORY DEVICE AND DATA WRITE METHOD FOR NONVOLATILE MEMORY DEVICE

This application claims foreign priority under 35 U.S.C. § 119 from Japanese Patent Application No. 2004-224130, filed on Jul. 30, 2004, incorporated by reference herein in its entirety.

BACKGROUND OF THE INVENTION

The present invention relates to a nonvolatile memory device and a data write method for a nonvolatile memory device.

As a measure to deal with a disturbance voltage applied to a nonvolatile memory element in a nonvolatile memory device, hierarchization of a wordline or a bitline has been known. In a nonvolatile memory device in which a bitline is made up of a main bitline and a sub-bitline, a plurality of sub-bitlines are connected with the main bitline, and a voltage supplied to the main bitline is supplied to the sub-bitline connected with a desired memory transistor by controlling a select switch provided for each sub-bitline. This prevents an unnecessary voltage from being supplied to the sub-bitline which is not connected with the desired memory transistor, whereby application of the disturbance voltage is prevented.

However, since an unnecessary voltage is applied to a control gate of the memory transistor other than the desired memory transistor, power consumption is increased.

SUMMARY

According to a first aspect of the invention, there is provided a nonvolatile memory device, comprising:

a plurality of memory cell blocks, N memory cell blocks (N is an integer equal to or greater than 2) being arranged in a row direction, L memory cell blocks (L is an integer equal to or greater than 2) being arranged in a column direction, and each of the memory cell blocks including M memory cells (M is an integer equal to or greater than 2);

a plurality of wordlines;

a plurality of first control gate lines; and a plurality of bitlines, wherein each of the memory cells includes one of nonvolatile memory elements and one of wordline switches, one end of one of the nonvolatile memory elements being connected to one end of one of the wordline switches;

wherein each of the wordlines connects in common gate electrodes of the wordline switches of the memory cells in the N memory cell blocks arranged in the row direction;

wherein each of the bitlines connects in common the other ends of the wordline switches of the L memory cells arranged in the column direction;

wherein one of the first control gate lines is disposed in each of the memory cell blocks and connects in common control gate electrodes of the nonvolatile memory elements of the M memory cells; and wherein, when writing data into the memory cells in a selected memory cell block selected from among the memory cell blocks, the wordline switches of the memory cells in the selected memory cell block are turned ON by applying a wordline write voltage to the wordlines connected to the memory cells in the selected memory cell block, a bitline write voltage is applied to the bitlines connected to the memory cells in the selected memory cell block, and a control gate line write voltage is applied to one of the first control gate lines disposed in the selected memory cell block.

According to a second aspect of the present invention, there is provided a data write method for a nonvolatile memory device, the nonvolatile memory device including: a plurality of memory cell blocks, N memory cell blocks (N is an integer equal to or greater than 2) being arranged in a row direction, L memory cell blocks (L is an integer equal to or greater than 2) being arranged in a column direction, and each of the memory cell blocks including M memory cells (M is an integer equal to or greater than 2); a plurality of wordlines, each of which connects in common gate electrodes of wordline switches of M×N memory cells arranged in a row direction among the memory cells, each of the memory cells including one of nonvolatile memory elements and one of the wordline switches, one end of one of the nonvolatile memory elements being connected to one end of one of the wordline switches; a plurality of first control gate lines, each of which is disposed in each of the memory cell blocks and connects in common control gate electrodes of the nonvolatile memory elements of the M memory cells; and a plurality of bitlines, each of which connects in common the other ends of the wordline switches of the L memory cells arranged in the column direction, wherein, when writing data into the memory cells in a selected memory cell block selected from among the memory cell blocks, the wordline switches of the memory cells in the selected memory cell block are turned ON by applying a wordline write voltage to the wordlines connected to the memory cells in the selected memory cell block, a bitline write voltage is applied to the bitlines connected to the memory cells in the selected memory cell block, and a control gate line write voltage is applied to one of the first control gate lines disposed in the selected memory cell block.

DETAILED DESCRIPTION OF THE EMBODIMENT

Figure 1:
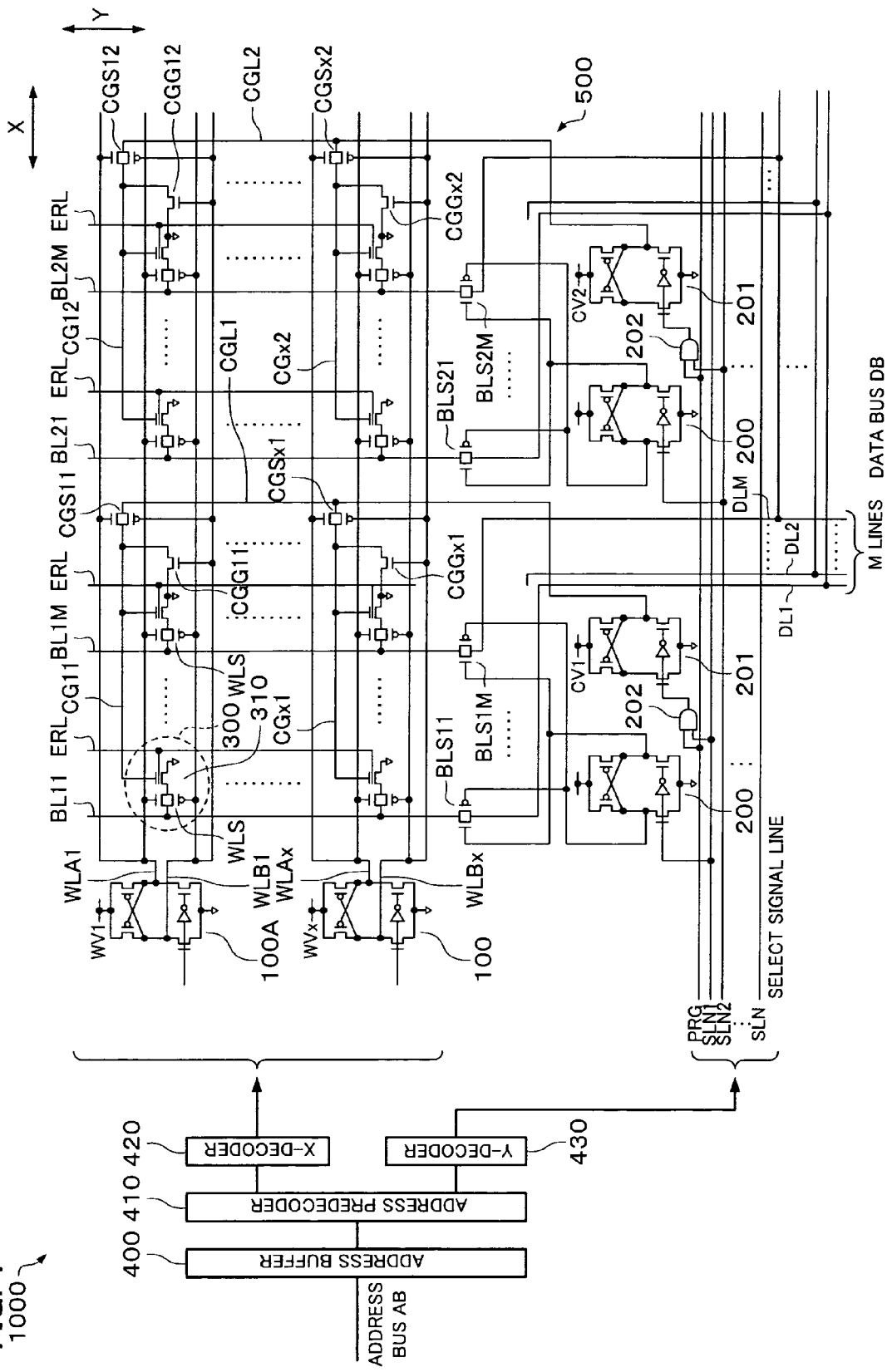
FIG. 1 is a circuit diagram showing a nonvolatile memory device according to one embodiment of the invention.

The invention may provide a nonvolatile memory device and a data write method for a nonvolatile memory device capable of reducing power consumption and reducing deterioration of a nonvolatile memory element.

According to one embodiment of the invention, there is provided a nonvolatile memory device, comprising:

a plurality of memory cell blocks, N memory cell blocks (N is an integer equal to or greater than 2) being arranged in a row direction, L memory cell blocks (L is an integer equal to or greater than 2) being arranged in a column direction, and each of the memory cell blocks including M memory cells (M is an integer equal to or greater than 2);

a plurality of wordlines;

a plurality of first control gate lines; and a plurality of bitlines, wherein each of the memory cells includes one of nonvolatile memory elements and one of wordline switches, one end of one of the nonvolatile memory elements being connected to one end of one of the wordline switches;

wherein each of the wordlines connects in common gate electrodes of the wordline switches of the memory cells in the N memory cell blocks arranged in the row direction;

wherein each of the bitlines connects in common the other ends of the wordline switches of the L memory cells arranged in the column direction;

wherein one of the first control gate lines is disposed in each of the memory cell blocks and connects in common control gate electrodes of the nonvolatile memory elements of the M memory cells; and wherein, when writing data into the memory cells in a selected memory cell block selected from among the memory cell blocks, the wordline switches of the memory cells in the selected memory cell block are turned ON by applying a wordline write voltage to the wordlines connected to the memory cells in the selected memory cell block, a bitline write voltage is applied to the bitlines connected to the memory cells in the selected memory cell block, and a control gate line write voltage is applied to one of the first control gate lines disposed in the selected memory cell block.

In this embodiment, the control gate line write voltage is applied to the first control gate line disposed in the selected memory cell block, and the control gate line write voltage is prevented from being supplied to the first control gate line disposed in the memory cell block other than the selected memory cell block. This reduces power consumption when writing data.

The nonvolatile memory device may further comprise:

a Y-decoder which outputs a plurality of bitline select signals; and

M×N bitline switches, each of which is ON/OFF-controlled by one of the bitline select signals, wherein M bitlines among the bitlines may be connected to each of the N memory cell blocks arranged in the row direction;

wherein one end of each of M bitline switches in the bitline switches may be connected to one of the M bitlines, and the other end of each of the M bitline switches may be connected to one of M signal lines of a data bus; and wherein, when writing data into the memory cells in the selected memory cell block, the bitline write voltage or a bitline unselect voltage may be supplied to the M signal lines of the data bus, the Y-decoder may set the bitline select signals for controlling the bitline switches active so that the bitline switches are turned ON, the bitline switches being connected to the bitlines for the selected memory cell block, and the bitline write voltage or the bitline unselect voltage may be applied to the bitlines connected to the memory cells in the selected memory cell block by supplying the voltages applied to the M signal lines of the data bus to the M bitlines for the selected memory cell block.

In this embodiment, the bitline write voltage is applied to the bitlines corresponding to the selected memory cell block, and the bitline write voltage is prevented from being supplied to the bitlines corresponding to the memory cell block other than the selected memory cell block. This prevents deterioration of the memory cells in the memory block other than the selected memory cell block when writing data.

The nonvolatile memory device may further comprise:

a plurality of second control gate lines, wherein one ends of the first control gate lines may be respectively connected to one ends of first control gate switches;

wherein each of the second control gate lines may connect in common the other ends of part of the first control gate switches respectively connected to the L memory cell blocks arranged in the column direction;

wherein the first control gate switches may be ON/OFF-controlled through the wordlines; and wherein, when writing data into the memory cells in the selected memory cell block, the control gate line write voltage may be applied to one of the second control gate lines connected to one of the first control gate switches which is connected to one of the first control gate lines disposed in the selected memory cell block, a control gate line unselect voltage may be applied to one of the second control gate lines which is not connected to one of the first control gate switches which is connected to one of the first control gate lines disposed in the selected memory cell block, and one of the first control gate switches connected to one of the first control gate lines disposed in the selected memory cell block may be turned ON by applying the wordline write voltage to the wordlines connected to the selected memory cell block, thereby supplying the control gate line write voltage to one of the first control gate lines disposed in the selected memory cell block.

In this embodiment, the control gate line write voltage is applied to the second control gate line connected with the first control gate switch in the selected memory block, and the control gate line unselect voltage is applied to the remaining second control gate line. Therefore, the control gate line write voltage is prevented from being supplied to the first control gate line in the memory cell block disposed in a column differing from the column of the selected memory cell block. This reduces power consumption when writing data.

In this nonvolatile memory device, the control gate write voltage may be supplied to the second control gate lines based on the bitline select signals; and when writing data into the memory cells in the selected memory cell block, the control gate line write voltage may be applied to one of the second control gate lines connected to one of the first control gate switches which is connected to one of the first control gate lines disposed in the selected memory cell block based on the bitline select signals set to active, and the control gate line unselect voltage may be applied to one of the second control gate lines which is not connected to one of the first control gate switches corresponding to the selected memory cell block based on the bitline select signals set to non-active.

In this embodiment, the control gate line write voltage or the control gate line unselect voltage is applied to the second control gate lines based on the bitline select signal set to non-active.

In this nonvolatile memory device, one end of one of second control gate switches which is ON/OFF-controlled through the wordlines may be connected to one of the first control gate lines;

the other end of one of the second control gate switches may be grounded; and when writing data into the memory cells in the selected memory cell block, one of the second control gate switches connected to one of the first control gate lines disposed in the selected memory cell block may be turned OFF, and a wordline unselect voltage may be applied to part of the wordlines not connected to the selected memory cell block so that one of the second control gate switches connected to one of the first control gate lines disposed in one of the memory cell blocks connected to part the wordlines to which the wordline unselect voltage is applied is turned ON, thereby causing one of the first control gate lines disposed in one of the memory cell blocks disposed in a row other than a row of the selected memory cell block to be grounded.

In this embodiment, the first control gate line in the memory cell block disposed in a row differing from the row of the selected memory cell block is grounded when writing data into the memory cell in the selected memory block. This prevents deterioration of the memory cells in the memory block disposed in a row differing from the row of the selected memory cell block.

According to one embodiment of the present invention, there is provided a data write method for a nonvolatile memory device, the nonvolatile memory device including:

a plurality of memory cell blocks, N memory cell blocks (N is an integer equal to or greater than 2) being arranged in a row direction, L memory cell blocks (L is an integer equal to or greater than 2) being arranged in a column direction, and each of the memory cell blocks including M memory cells (M is an integer equal to or greater than 2);

a plurality of wordlines, each of which connects in common gate electrodes of wordline switches of M×N memory cells arranged in a row direction among the memory cells, each of the memory cells including one of nonvolatile memory elements and one of the wordline switches, one end of one of the nonvolatile memory elements being connected to one end of one of the wordline switches;

a plurality of first control gate lines, each of which is disposed in each of the memory cell blocks and connects in common control gate electrodes of the nonvolatile memory elements of the M memory cells; and a plurality of bitlines, each of which connects in common the other ends of the wordline switches of the L memory cells arranged in the column direction, wherein, when writing data into the memory cells in a selected memory cell block selected from among the memory cell blocks, the wordline switches of the memory cells in the selected memory cell block are turned ON by applying a wordline write voltage to the wordlines connected to the memory cells in the selected memory cell block, a bitline write voltage is applied to the bitlines connected to the memory cells in the selected memory cell block, and a control gate line write voltage is applied to one of the first control gate lines disposed in the selected memory cell block.

In this data write method for a nonvolatile memory device, when writing data into the memory cells in the selected memory cell block, the bitline write voltage or a bitline unselect voltage may be supplied to signal lines of a data bus, one end of each of M bitline switches being connected to one of M bitlines among the bitlines, and the other end of each of the M bitline switches being connected to one of the signal lines of the data bus, bitline select signals for controlling the M bitline switches connected to part of the bitlines connected to the memory cells in the selected memory cell block may be set active so that the M bitline switches are turned ON, and the bitline write voltage or the bitline unselect voltage may be applied to part of the bitlines connected to the memory cells in the selected memory cell block by supplying the voltages applied to the signal lines of the data bus to the M bitlines for the selected memory cell block.

In this data write method for a nonvolatile memory device, when writing data into the memory cells in the selected memory cell block, the control gate line write voltage may be applied to one of the second control gate lines connected to one of the first control gate switches which is connected to one of the first control gate lines disposed in the selected memory cell block, a control gate line unselect voltage may be applied to one of the second control gate lines which is not connected to one of the first control gate switches which is connected to one of the first control gate lines disposed in the selected memory cell block, and one of the first control gate switches connected to one of the first control gate lines disposed in the selected memory cell block may be turned ON by applying the wordline write voltage to the wordlines connected to the selected memory cell block, thereby supplying the control gate line write voltage to one of the first control gate lines disposed in the selected memory cell block.

In this data write method for a nonvolatile memory device, when writing data into the memory cells in the selected memory cell block, the control gate line write voltage may be applied to one of the second control gate lines connected to one of the first control gate switches which is connected to one of the first control gate lines disposed in the selected memory cell block based on the bitline select signals set to active, and the control gate line unselect voltage may be applied to one of the second control gate lines which is not connected to one of the first control gate switches corresponding to the selected memory cell block based on the bitline select signals set to non-active.

In this data write method for a nonvolatile memory device, when writing data into the memory cells in the selected memory cell block, one of the second control gate switches connected to one of the first control gate lines disposed in the selected memory cell block may be turned OFF, and a wordline unselect voltage may be applied to part of the wordlines not connected to the selected memory cell block so that one of the second control gate switches connected to one of the first control gate lines disposed in one of the memory cell blocks connected to part the wordlines to which the wordline unselect voltage is applied is turned ON, thereby causing one of the first control gate lines disposed in one of the memory cell blocks disposed in a row other than a row of the selected memory cell block to be grounded.

These embodiments of the invention will be described below with reference to the drawings. Note that the embodiments described below do not in any way limit the scope of the invention laid out in the claims herein. In addition, not all of the elements of the embodiments described below should be taken as essential requirements of the present invention.

JP-A-8-222649 discloses a nonvolatile memory device in which a wordline and a bitline are hierarchized as a measure to deal with the disturbance voltage applied to a nonvolatile memory element. An embodiment of the invention can solve the problems in the above-mentioned nonvolatile memory device.

1. Memory Cell Array

FIG. 1 is a circuit diagram showing a nonvolatile memory device 1000. The nonvolatile memory device 1000 includes a wordline level shifter 100, a bitline level shifter 200, an address buffer 400, an address predecoder 410, an X-decoder 420, a Y-decoder 430, and a memory cell array 500. However, the invention is not limited thereto. For example, the nonvolatile memory device 1000 may be configured to exclude the address buffer 400 and the address predecoder 410. In the drawings, sections indicated by the same symbols have the same meanings.

In the nonvolatile memory device 1000 in this embodiment, data is written or read through an address bus AB and a data bus DB. The data bus DB includes M (M is an integer equal to or greater than 2) data lines DL1 to DLM.

When address information has been stored in the address buffer 400 through the address bus AB, the address predecoder 410 performs decode processing and outputs the decoded results to the X-decoder 420 and the Y-decoder 430. The X-decoder 420 outputs an active or non-active wordline select signal to each wordline level shifter 100 based on the decode processing results from the address predecoder 410.

The wordline level shifter 100 supplies two types of voltages supplied to the wordline level shifter 100 to the memory cell array 500 through two wordlines based on the wordline select signal from the X-decoder 420, for example. In more detail, when the wordline select signal from the X-decoder 420 is set to non-active, the wordline level shifter 100A supplies a voltage input to an input WV1 of the wordline level shifter 100A to a wordline WLA1, and supplies a ground-level voltage to a wordline WLB1. When the wordline select signal from the X-decoder 420 is set to non-active, the wordline level shifter 100A supplies a voltage input to the input WV1 of the wordline level shifter 100A to the wordline WLB1, and supplies a ground-level voltage to the wordline WLA1. The voltages input to the inputs WV1 to WVx (x is an integer equal to or greater than 2) of the wordline level shifters 100 are arbitrarily set depending on each operation of writing, erasing, and reading of data. The details of the operation are described later.

In the memory cell array 500, N (N is an integer equal to or greater than 2) memory cell blocks are arranged in a row direction X, and L (L is an integer equal to or greater than 2) memory cell blocks are arranged in a column direction Y Each memory block includes M (M is an integer equal to or greater than 2) memory cells 300. The memory cell array 500 includes a plurality (e.g. N×M) of bitlines BL11 to BLNM formed to extend along the column direction Y The memory cell 300 includes a wordline switch WLS and a nonvolatile memory element 310. The wordline switch WLS is a CMOS switch, for example. One of two wordlines connected with each wordline level shifter 100 connects one gate electrode of the wordline switch WLS of each memory cell 300 arranged in the row direction X. The other wordline connected with each wordline level shifter 100 connects the other gate electrode of the wordline switch WLS of each memory cell 300 arranged in the row direction X. In more detail, the wordline WLA1 of the wordlines WLA1 and WLB1 connected with the wordline level shifter 100A connects one gate electrode of the wordline switch WLS of each memory cell 300 arranged in the row direction X, for example. The wordline WLB1 connects the other gate electrode of the wordline switch WLS of each memory cell 300 arranged in the row direction X.

One end of the wordline switch WLS of each memory cell 300 is connected with a source or a drain of the nonvolatile memory element 310. The other end of the wordline switch WLS of each memory cell 300 arranged in the column direction Y is connected with the bitline. In more detail, the other end of the wordline switch WLS of each memory cell 300 arranged in the column direction Y is connected with the bitline BL11, for example.

A plurality of first control gate lines CG11 to CGxN (first control gate lines in a broad sense) are arranged in the memory cell array 500. For example, N first control gate lines CG11 to CG1N are arranged along the row direction X. x control gate lines CG11 to CGx1 are arranged in the column direction Y. Each of the first control gate lines CG11 to CGxN connects gate electrodes of the nonvolatile memory elements 310 of the M memory cells 300. The first control gate lines CG11 to CGxN are respectively connected with one end of first control gate switches CGS11 to CGSxN. The first control gate switches CGS11 to CGSxN are CMOS switches, for example. However, the invention is not limited thereto. In more detail, the control gate line CG11 is connected with one end of the first control gate switch CGS11, and connects the gate electrode of the nonvolatile memory element 310 of each of the M memory cells 300, for example.

The wordline is connected with gate electrodes of the first control gate switches CGS11 to CGSxN. One of two wordlines connected with each wordline level shifter 100 connects one gate electrode of each of the N first control gate switches connected with the N first control gate lines arranged along the row direction X. The other wordline connected with each wordline level shifter 100 connects the other gate electrode of each of the N first control gate switches connected with the N first control gate lines arranged along the row direction X. In more detail, the wordline WLA1 connects one gate electrode of each of the N first control gate switches CGS11 to CGS1N, and the wordline WLB1 connects the other gate electrode of each of the N first control gate switches CGS11 to CGS1N, for example.

The first control gate lines CG11 to CGxN are respectively connected with one end of each of second control gate switches CGG11 to CGGxN. The second control gate switches CGG11 to CGGxN are NMOS switches, for example. However, the invention is not limited thereto. Gate electrodes of the second control gate switches among the second control gate switches CGG11 to CGGxN arranged along the row direction X are connected with one of the two wordlines connected with each wordline level shifter 100. In more detail, the first control gate line CG11 is connected with one end of the second control gate switch CGG11. The other end of each of the second control gate switches CGG11 to CGGxN is connected with GND. The gate electrodes of the second control gate switches CGG11 to CGG1N are connected with the wordline WLB1, for example. However, the invention is not limited thereto. The gate electrodes of the second control gate switches CGG11 to CGG1N may be connected so that a signal in the same phase as that of the wordline WLB1 is supplied.

N second control gate lines are arranged in the memory cell array 500, for example. Each second control gate line connects the other end of each of the first control gate switches arranged along the column direction Y, and is connected with a control gate line level shifter 201 described later. In more detail, the second control gate line CGL1 connects the other end of each of the first control gate switches CGS11 to CGSx1, and is connected with the control gate line level shifter 201, for example.

The bitlines BL11 to BLNM are respectively connected with one end of each of bitline switches BLS11 to BLSNM. The bitline switches BLS11 to BLSNM are CMOS switches, for example. However, the invention is not limited thereto. The data lines DL1 to DLM of the data bus DB are respectively connected with the other end of each of the bitline switches BLS11 to BLSNM, and the bitlines BL11 to BLNM are respectively connected with the data bus DB through the bitline switches BLS11 to BLSNM.

In more detail, the data lines DL1 to DLM are respectively connected with the bitlines BL11 to BL1M through the bitline switches BLS11 to BLS1M, for example. The data lines DL1 to DLM are respectively connected with the bitlines BL21 to BL2M through the bitline switches BLS21 to BLS2M, for example.

The bitline switches BLS11 to BLSNM are ON/OFF-controlled by each bitline level shifter 200. The bitline level shifter 200 ON/OFF-controls the M bitline switches BLS11 to BLS1M based on a select signal from one of the select signal lines SL1 to SLN, for example. In more detail, the bitline level shifter 200 which has received the select signal set to non-active from the select signal line SL1 turns ON the M bitline switches BLS11 to BLS1M, for example.

When writing data, an active signal (e.g. high-level signal or voltage Vpp) is supplied to a program signal line PRG from the Y-decoder 430, for example. An output of each AND circuit 202 is connected with the control gate line level shifter 201. It suffices that the AND circuit 202 perform a logical AND operation. One input of each AND circuit 202 is connected with the program signal line PRG. The other input of each AND circuit 202 is exclusively connected with one of the select signal lines SL1 to SLN. Specifically, when writing data, one of the AND circuits 202 outputs a high-level signal to the control gate line level shifter 201 by supplying an active signal to the program signal line PRG and one of the select signal lines SL1 to SLN. This causes a voltage input to an input CV1 of the control gate line level shifter 201 to be supplied to the corresponding second control gate line of the second control gate lines CGL1 to CGLN. For example, a control gate write voltage (e.g. 8 V) is supplied to the input CV1 of the control gate line level shifter 201.

In the case where the nonvolatile memory element 310 is an element in which data is written or erased by injecting or discharging electrons into or from a floating gate, an erase line ERL may be connected with the floating gate of the nonvolatile memory element 310. In this embodiment, the nonvolatile memory element 310 having a floating gate is described as an example. However, the invention is not limited thereto.

Figure 2:
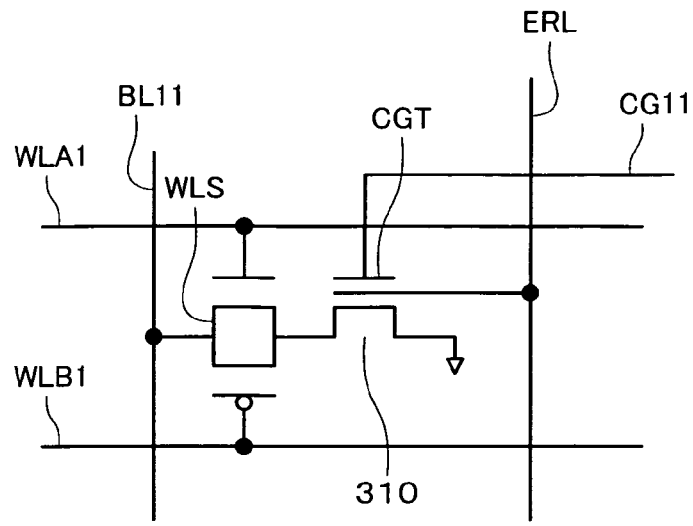
FIG. 2 is a circuit diagram showing a memory cell of a nonvolatile memory device according to one embodiment of the invention.

FIG. 2 is a circuit diagram showing a configuration of the memory cell 300. One gate electrode of the wordline switch WLS of the memory cell 300 is connected with one of the wordlines WLA1 to WLAx (e.g. wordline WLA1), and the other gate electrode of the wordline switch WLS is connected with one of the wordlines WLB1 to WLBx (e.g. wordline WLB1). One end of the wordline switch WLS is connected with one of the bitlines BL11 to BLNM (e.g. bitline BL1), and the other end of the wordline switch WLS is connected with the drain (or source) of the nonvolatile memory element 310, for example. In this case, the source (or drain) of the nonvolatile memory element 310 is grounded and provided with a ground-level voltage, for example. One of the first control gate lines CG11 to CGxN (e.g. first control gate line CG11) is connected with a control gate CGT of the nonvolatile memory element 310. The erase line ERL is connected with the floating gate of the nonvolatile memory element 310. However, the invention is not limited thereto. A configuration in which the erase line ERL is not connected with each memory cell 300 may also be employed.

For example, the wordline switch WLS is turned ON when a high-level signal is supplied to the wordline WLA1 and a low-level signal is supplied to the wordline WLB1. This causes the bitline BL11 to be electrically connected with the drain of the nonvolatile memory element 310, for example. Specifically, data can be written into or read from the memory cell 300 when the wordline switch WLS is turned ON through the wordlines WLA1 and WLB1.

When writing data into the memory cell 300 shown in FIG. 2, the wordline switch WLS is turned ON through the wordlines WLA1 and WLB1. A bitline write voltage (e.g. 8 V) is supplied to the bitline BL11, and a control gate write voltage (e.g. 8 V) is supplied to the first control gate line CG11. When reading data from the memory cell 300 shown in FIG. 2, a control gate read voltage (e.g. 0 V) is supplied to the first control gate line CG11. When erasing data from the memory cell 300, an erase voltage (e.g. 20 V) is applied to the erase line ERL. Table 1 shows operation voltages when performing a data write operation, a data read operation, and a data erase operation for the memory cell 300 shown in FIG. 2. In the data write operation, the bitline write voltage is set at 8 V when writing data into the memory cell 300, and the bitline write voltage is set at a ground level when not writing data into the memory cell 300, for example. In the data read operation, the voltage of the bitline BL11 is detected using a sense amplifier or the like.

TABLE 1

|  | Data write | Data read | Data erase |
| --- | --- | --- | --- |
| Wordline WLA1 | Wordline write voltage (e.g. 8 V) | Wordline read voltage (e.g. 2.75 V) | Ground level |
| First control gate line CG11 | Control gate write voltage (e.g. 8 V) | Control gate read voltage (e.g. 0 V) | Ground level |
| Bitline BL11 | Bitline write voltage (e.g. 8 V when writing data, and ground level when not writing data) | Detection using sense amplifier | Ground level |
| Erase line ERL | Ground level | Ground level | Erase voltage (e.g. 20 V) |

In this embodiment, a single-layer polysilicon type memory element is used as the nonvolatile memory element 310. However, the invention is not limited thereto. The invention may be applied to a nonvolatile memory element in which electrons are injected into or discharged from a floating gate. For example, a stacked type nonvolatile memory element (e.g. PROM or MONOS type memory element in which a control gate is stacked on a floating gate) may be used as the nonvolatile memory element 310 instead of the single-layer polysilicon type memory element.

Figure 3:
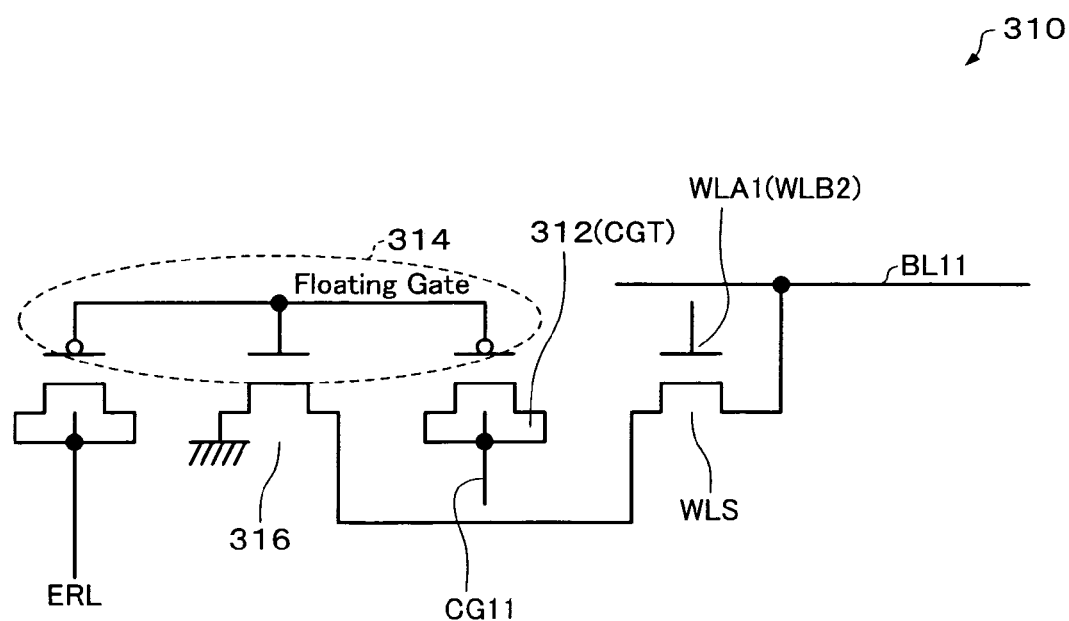
FIG. 3 is a circuit diagram showing a memory cell according to one embodiment of the invention.

FIG. 3 is a circuit diagram showing a configuration of the nonvolatile memory element 310. In the single-layer polysilicon type memory element 310, an impurity diffusion region 312 functions as the control gate CGT shown in FIG. 2. An area enclosed by the dotted line and indicated by a symbol 314 functions as the floating gate, and electrons are injected into the floating gate indicated by the symbol 314 when writing data. The first control gate line CG11 is connected with the impurity diffusion region 312, for example. One end of the wordline switch WLS is connected with the bitline BL11, and the other end of the wordline switch WLS is connected with a transistor 316, for example. When a high-level signal is supplied to the wordline WLA1, the wordline switch WLS is turned ON, whereby the bitline BL11 is electrically connected with the transistor 316.

2. Writing of Data

Figure 4:
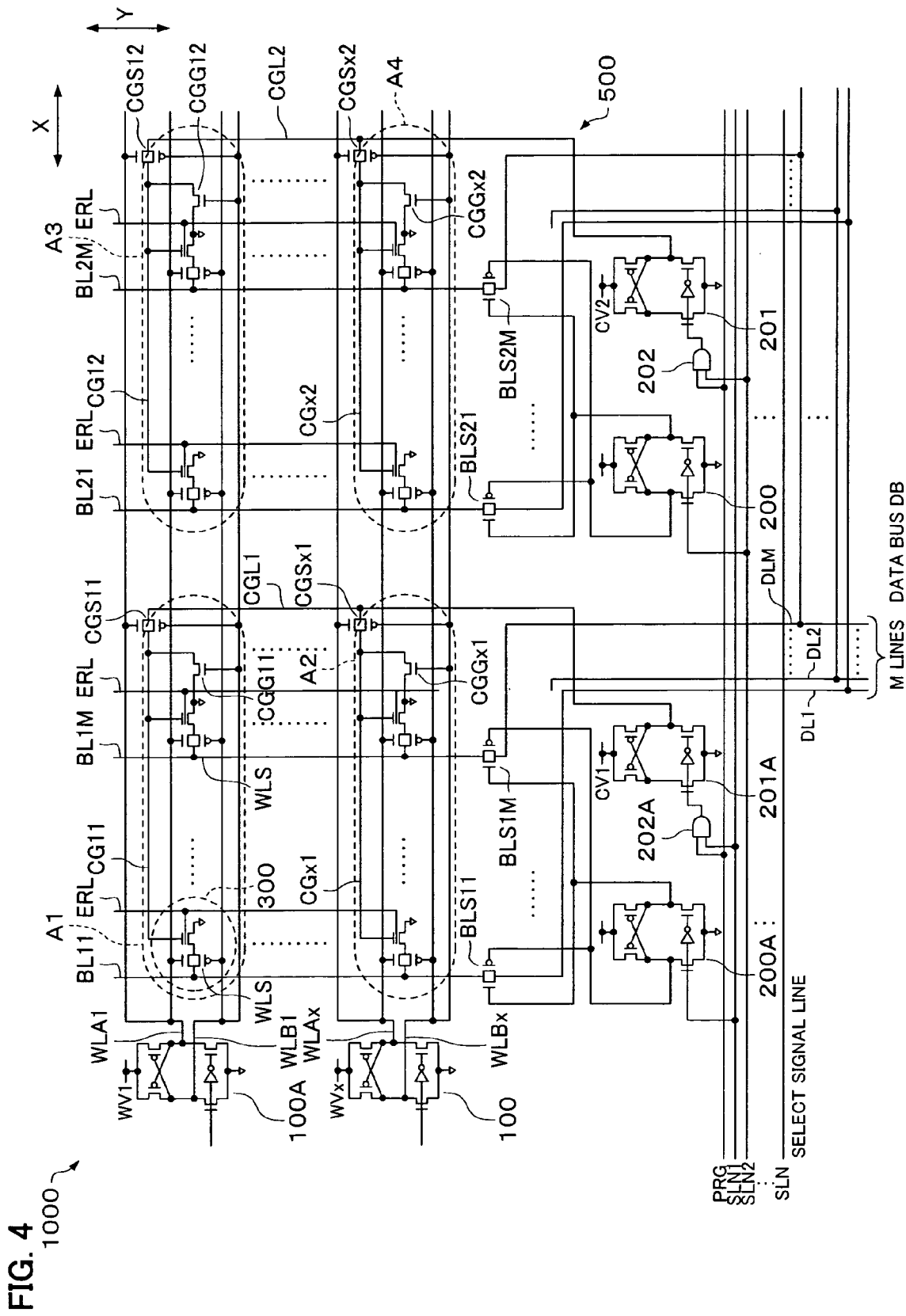
FIG. 4 is a circuit diagram showing a part of a memory cell array shown in FIG. 1.

FIG. 4 is a circuit diagram showing a part of the nonvolatile memory device 1000 shown in FIG. 1. In the nonvolatile memory device 1000, data is written in memory cell block units. In the memory cell array 500 in this embodiment, N (N is an integer equal to or greater than 2) memory cell blocks are disposed in the row direction X, and L (L is an integer equal to or greater than 2) memory cell blocks are disposed in the column direction Y. The memory cell block includes M memory cells 300, and is indicated by A1 to A4 shown in FIG. 4, for example.

A case of writing data into the memory cell block A1 is described below. In this case, the memory cell block A1 is called a selected memory cell block, and other memory cell blocks including the memory cell blocks A2 to A4 are called unselected memory cell blocks.

The X-decoder 420 outputs a signal set to non-active (e.g. high-level signal) to the wordline level shifter 100A as the wordline select signal, and outputs a signal set to non-active (e.g. low-level signal) to the remaining wordline level shifters 100.

The Y-decoder 430 supplies a select signal set to non-active to the select signal line SL1, and supplies a select signal set to non-active to the remaining (N-1) select signal lines SL2 to SLN. The Y-decoder 430 supplies an active signal (e.g. high-level signal or voltage Vpp) to the program signal line PRG.

The bitline write voltage or a ground-level voltage (bitline unselect voltage in a broad sense) is supplied to the M data lines DL1 to DLM which make up the data bus DB.

The wordline level shifter 100A receives the signal set to non-active (e.g. high-level signal) from the X-decoder 420, supplies the write wordline select voltage (wordline write voltage in a broad sense; e.g. 8 V) input to the input WV1 of the wordline level shifter 100A to the wordline WLA1, and supplies a ground-level voltage to the wordline WLB1. This causes the wordline switches WLS and the first control gate switches CGS11 to CGS1N in the selected memory cell block A1 and the memory cell block (e.g. memory cell block A3) arranged in the same row as the row of the selected memory cell block A1 to be turned ON, and causes the second control gate switches CGG11 to CGG1N in the selected memory cell block A1 and the memory cell block A3 to be turned OFF. Since the X-decoder 420 outputs a non-active signal (e.g. low-level signal) to the wordline level shifters 100 other than the wordline level shifter 100A, the wordline switches WLS and the first control gate switches CGS21 to CGSxN in the memory cell blocks (e.g. memory cell blocks A2 and A4) arranged in the row differing from the row of the selected memory cell block A1 are turned OFF, and the second control gate switches CGG21 to CGGxN are turned ON.

The bitline level shifter 200A receives an active select signal (e.g. high-level signal) through the select signal line SL1, and turns ON the bitline switches BLS11 to BLS1M. This causes the bitlines BL11 to BL1M to be electrically connected with the data lines DL1 to DLM, respectively.

Each of the remaining bitline level shifters 200 receives a non-active select signal, and turns OFF the corresponding bitline switches of the bitlines BL21 to BLNM.

Since an active signal is supplied to the program signal line PRG and the select signal line SL1, the AND circuit 202A connected with the control gate line level shifter 201A outputs a high-level signal to the control gate line level shifter 201A. This causes the control gate line level shifter 201A to supply a voltage provided to the input CV1, that is, the control gate write voltage (e.g. 8 V), to the second control gate line CGL1.

Each of the remaining control gate line level shifters 201 supplies a ground-level voltage (control gate unselect voltage in a broad sense) to the corresponding second control gate line of the second control gate lines CGL2 to CGLN in response to the non-active select signal supplied to each of the select signal lines SL2 to SLN.

The operation voltages of the memory cell blocks A1 to A4 during the write operation are described below using FIGS. 5 to 8. In each of the memory blocks A1 to A4 shown in FIGS. 5 to 8, M memory cells 300 are arranged along the row direction X, for example. However, some of the memory cells 300 are omitted for convenience of illustration.

Figure 5:
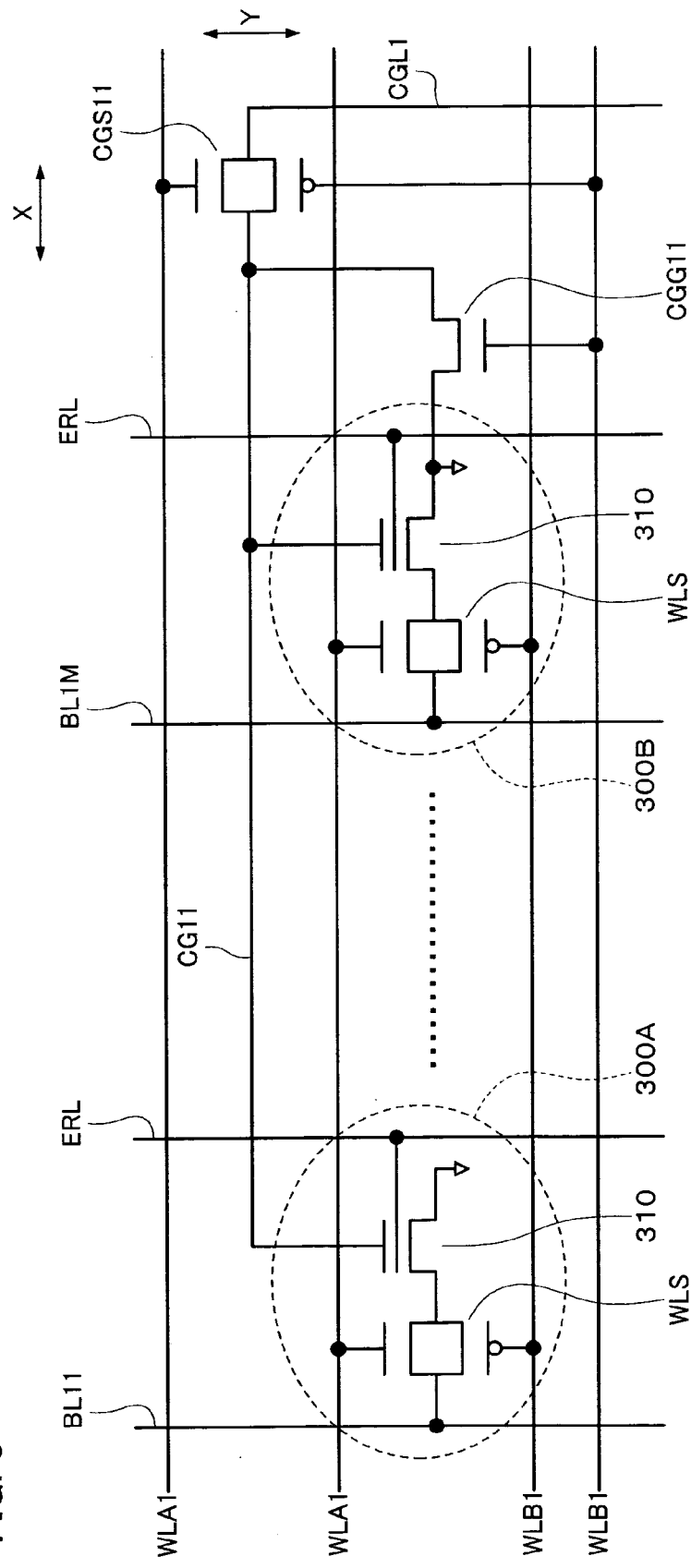
FIG. 5 is a circuit diagram showing a selected memory cell block in the memory cell array shown in FIG. 4.

FIG. 5 is a circuit diagram showing the memory cell block A1, that is, the selected memory cell block A1. The wordline level shifter 100A applies the write wordline select voltage (wordline write voltage in a broad sense) to the wordline WLA1, and applies a ground-level voltage to the wordline WLB1. This causes the wordline switches WLS of the memory cells 300 in the selected memory cell block A1 including the memory cells 300A and 300B and the first control gate switch CGS11 of the selected memory cell block A1 to be turned ON. Since the control gate write voltage is supplied to the second control gate line CGL1, the control gate write voltage is supplied to the first control gate line CG11 in the selected memory cell block A1 by causing the first control gate switch CGS11 to be turned ON. Specifically, the control gate write voltage is applied to the control gates CGT of the memory cells 300 in the selected memory cell block A1 including the memory cells 300A and 300B. Since the ground-level voltage is applied to the wordline WLB1, the second control gate switch CGG11 in the selected memory cell block A1 is turned OFF.

When writing data into the memory cell 300A, the bitline write voltage is supplied to the data line DL1 of the data bus DB shown in FIG. 3. This causes the bitline switches BLS11 to BLS1M corresponding to the selected memory cell block A1 to be turned ON, whereby the bitline write voltage is supplied to the bitline BL11. Specifically, the control gate write voltage (e.g. 8 V) is applied to the control gate CGT of the nonvolatile memory element 310 of the memory cell 300A, and the bitline write voltage is applied to the drain of the nonvolatile memory element 310 of the memory cell 300A through the bitline switch WLS, for example. Therefore, data is written into the nonvolatile memory element 310 of the memory cell 300A. The source of the nonvolatile memory element 310 of the memory cell 300A is grounded, for example. However, the invention is not limited thereto. A ground-level voltage may be supplied to the source of the nonvolatile memory element 310 of the memory cell 300A when writing data, for example.

When not writing data into the memory cell 300B, a ground-level voltage (bitline unselect voltage in a broad sense) is supplied to the data line DLM of the data bus DB shown in FIG. 3, for example. Since the bitline switches BLS11 to BLS1M corresponding to the selected memory cell block A1 are turned ON, the ground-level voltage is supplied to the bitline BL1M. Specifically, the control gate write voltage (e.g. 8 V) is applied to the control gate CGT of the nonvolatile memory element 310 of the memory cell 300B, and a ground-level voltage is applied to the drain of the nonvolatile memory element 310 of the memory cell 300B through the bitline switch WLS, for example. Therefore, data is not written into the nonvolatile memory element 310 of the memory cell 300B.

Figure 6:
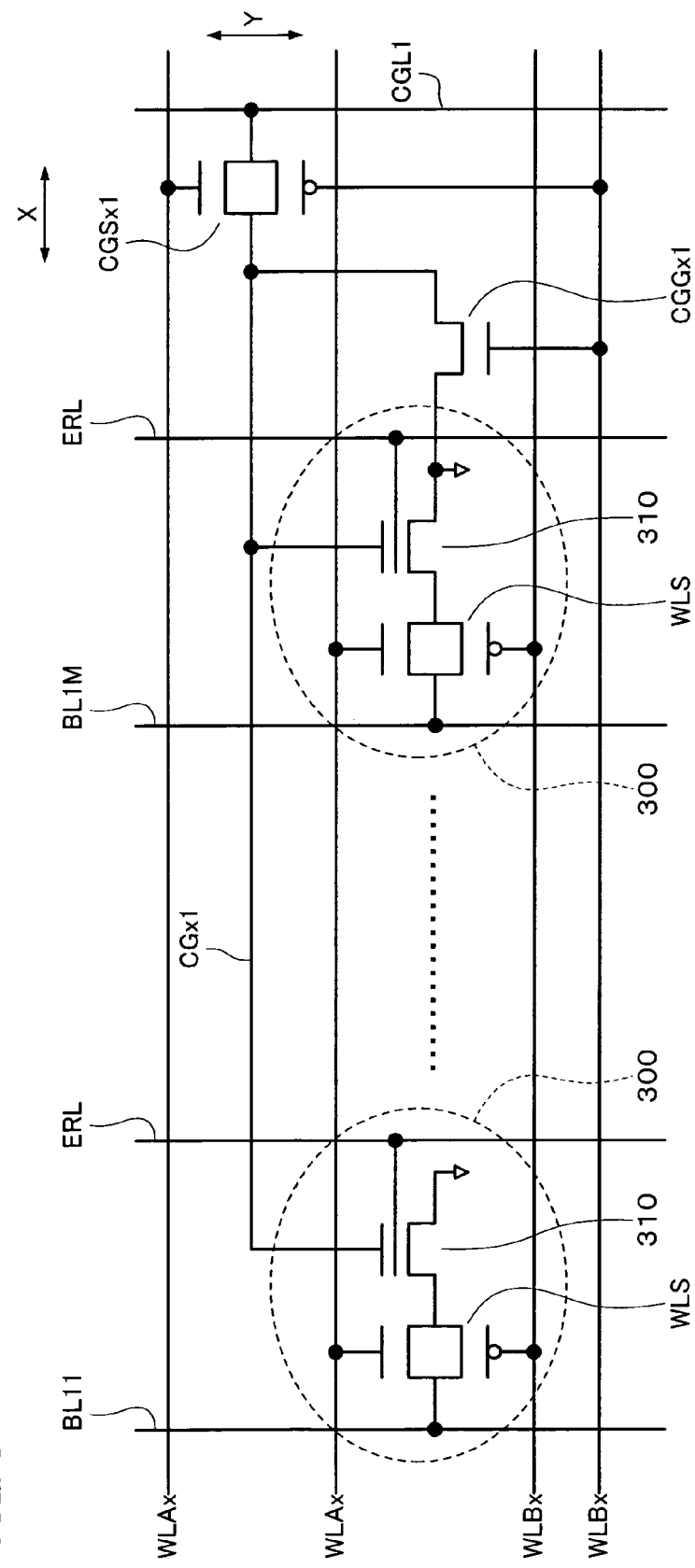
FIG. 6 is a circuit diagram showing another memory cell block in the memory cell array shown in FIG. 4.

FIG. 6 is a circuit diagram showing the memory cell block A2. The wordline level shifter 100 applies the wordline unselect voltage (e.g. ground-level voltage) to the wordline WLAx, and applies a high-level voltage (e.g. 8 V) to the wordline WLBx. This causes the wordline switches WLS of the memory cells 300 in the memory cell block A2 and the first control gate switch CGSx1 in the memory cell block A2 to be turned OFF. Since the high-level voltage is applied to the wordline WLBx, the second control gate switch CGGx1 in the memory cell block A2 is turned ON. Although the control gate write voltage is supplied to the second control gate line CGL1, the control gate write voltage is not supplied to the first control gate line CGx1 in the memory cell block A2 by causing the first control gate switch CGS11 to be turned OFF. In addition, since the second control gate switch CGGx1 in the memory cell block A2 is turned ON, a ground-level voltage is supplied to the first control gate line CGx1 in the memory cell block A2. Specifically, a ground-level voltage (control gate line unselect voltage in a broad sense) is applied to the control gates CGT of the memory cells 300 in the memory cell block A2.

Since the above-described voltage application causes the wordline switches WLS in the memory cell block A2 to be turned OFF, the bitline write voltage is not supplied to the drain of the nonvolatile memory element 310 of the memory cell 300, even if the bitline write voltage is supplied to at least one of the M bitlines BL11 to BL1M corresponding to the memory cell block A2. A ground-level voltage is applied to the control gate CGT of the nonvolatile memory element 310 of the memory cell 300 in the memory cell block A2. Specifically, even if data is written into the memory cell 300 in the selected memory cell block A1 shown in FIG. 5, data is not written into the M memory cells 300 in the memory cell block A2.

Figure 7:
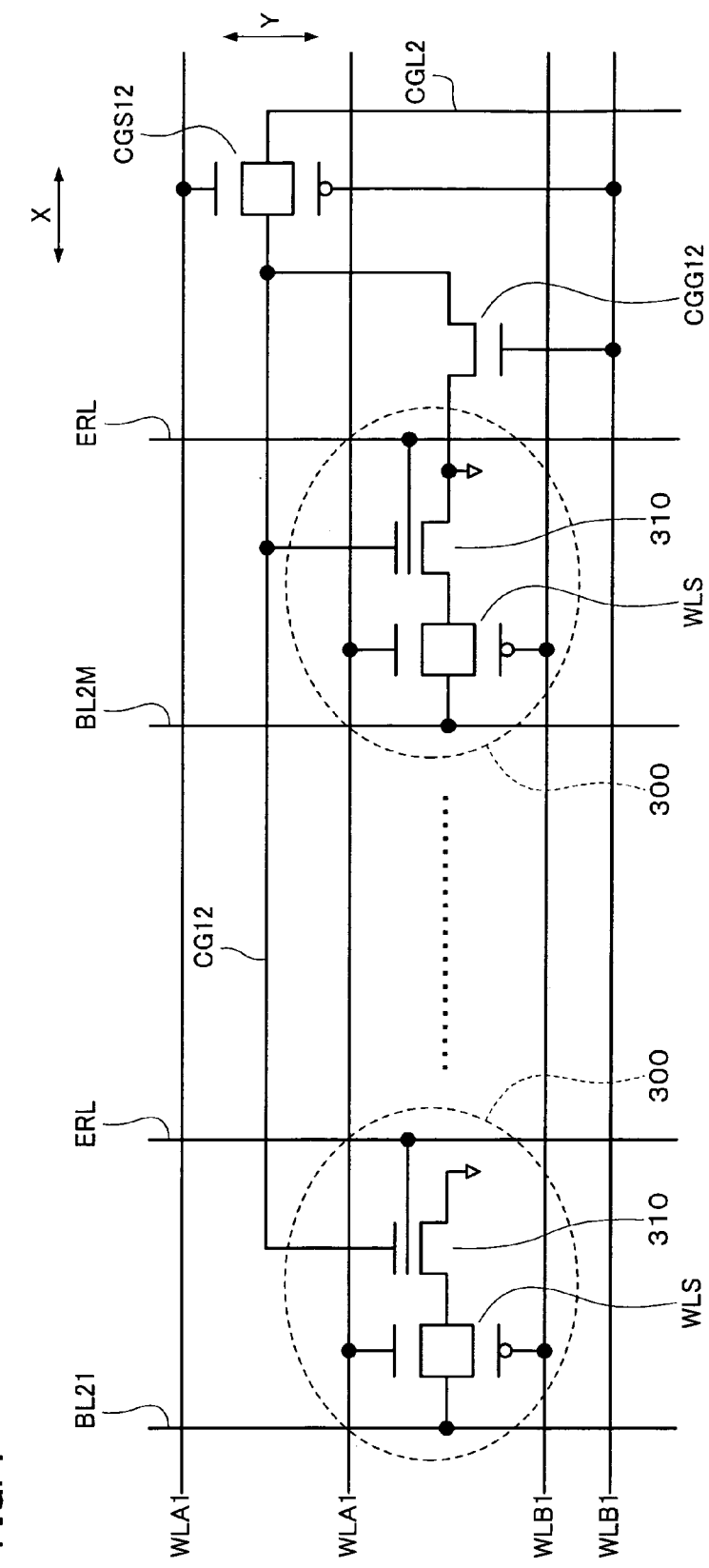
FIG. 7 is a circuit diagram showing a further memory cell block in the memory cell array shown in FIG. 4.

FIG. 7 is a circuit diagram showing the memory cell block A3. The wordline level shifter 100A applies the write wordline select voltage (wordline write voltage in a broad sense) to the wordline WLA1, and applies a ground-level voltage to the wordline WLB1. This causes the wordline switches WLS of the memory cells 300 in the memory cell block A3 and the first control gate switch CGS12 in the memory cell block A3 to be turned ON. Since the ground-level voltage (control gate line unselect voltage in a broad sense) is supplied to the second control gate line CGL2, the ground-level voltage is supplied to the first control gate line CG12 in the memory cell block A3 instead of the control gate write voltage, even if the first control gate switch CGS12 is turned ON. Specifically, the ground-level voltage is applied to the control gate CGT of the memory cell 300 in the memory cell block A3 instead of the control gate write voltage. Since the ground-level voltage is applied to the wordline WLB1, the second control gate switch CGG12 in the memory cell block A3 is turned OFF.

Since a signal set to non-active (e.g. low-level signal) is supplied to the select signal lines SL2 to SLN from the Y-decoder 430 shown in FIG. 1, the bitline write voltage is not supplied from the data lines DL1 to DLM of the data bus DB to the M bitlines BL21 to BL2M corresponding to the memory cell block A3. Therefore, the drain of the nonvolatile memory element 310 of the memory cell 300 of the memory cell block A3 is set in a floating state, for example. Specifically, the ground-level voltage is applied to the control gate CGT of the nonvolatile memory element 310 of the memory cell 300 in the memory cell block A3, the ground-level voltage is supplied to the source of the nonvolatile memory element 310, and the drain of the memory element 310 is set in a floating state, for example. Therefore, data is not written into the memory cell 300 in the memory cell block A3. Specifically, even if data is written into the memory cell 300 in the selected memory cell block A1 shown in FIG. 5, data is not written into the M memory cells 300 in the memory cell block A3.

Figure 8:
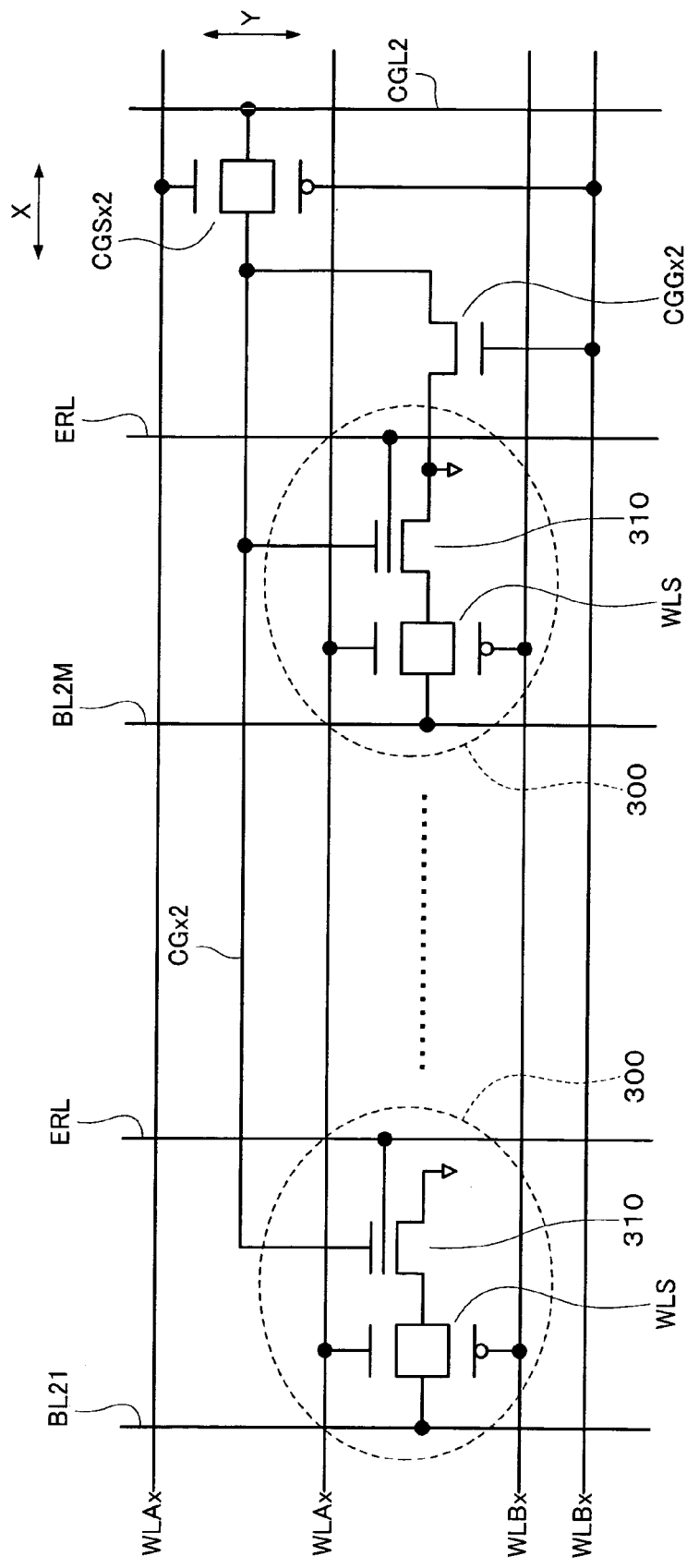
FIG. 8 is a circuit diagram showing a still further memory cell block in the memory cell array shown in FIG. 4.

FIG. 8 is a circuit diagram showing the memory cell block A4. The wordline level shifter 100 applies the wordline unselect voltage (e.g. ground-level voltage) to the wordline WLAx, and applies a high-level voltage (e.g. 8 V) to the wordline WLBx. This causes the wordline switches WLS of the memory cells 300 in the memory cell block A4 and the first control gate switch CGSx2 in the memory cell block A4 to be turned OFF. Since the high-level voltage is applied to the wordline WLBx, the second control gate switch CGGx2 in the memory cell block A4 is turned ON. A ground-level voltage (control gate unselect voltage in a broad sense) is supplied to the second control gate line CGL2. Since the second control gate switch CGGx2 of the memory cell block A4 is turned ON, a ground-level voltage is supplied to the first control gate line CGx2 in the memory cell block A4. Specifically, the ground-level voltage (control gate line unselect voltage in a broad sense) is applied to the control gate CGT of the memory cell 300 in the memory cell block A4.

Since a signal set to non-active (e.g. low-level signal) is supplied to the select signal lines SL2 to SLN from the Y-decoder 430 shown in FIG. 1, the bitline write voltage is not supplied from the data lines DL1 to DLM of the data bus DB to the M bitlines BL21 to BL2M corresponding to the memory cell block A4. Therefore, the drain of the nonvolatile memory element 310 of the memory cell 300 in the memory cell block A4 is set in a floating state, for example. Specifically, the ground-level voltage is applied to the control gate CGT of the nonvolatile memory element 310 of the memory cell 300 in the memory cell block A4, the ground-level voltage is supplied to the source of the memory element 310, and the drain of the memory element 310 is set in a floating state, for example. Therefore, data is not written into the memory cell 300 in the memory cell block A4. Specifically, even if data is written into the memory cell 300 in the selected memory cell block A1 shown in FIG. 5, data is not written into the M memory cells 300 in the memory cell block A4.

3. Comparative Example and Effect of this Embodiment

Figure 9:
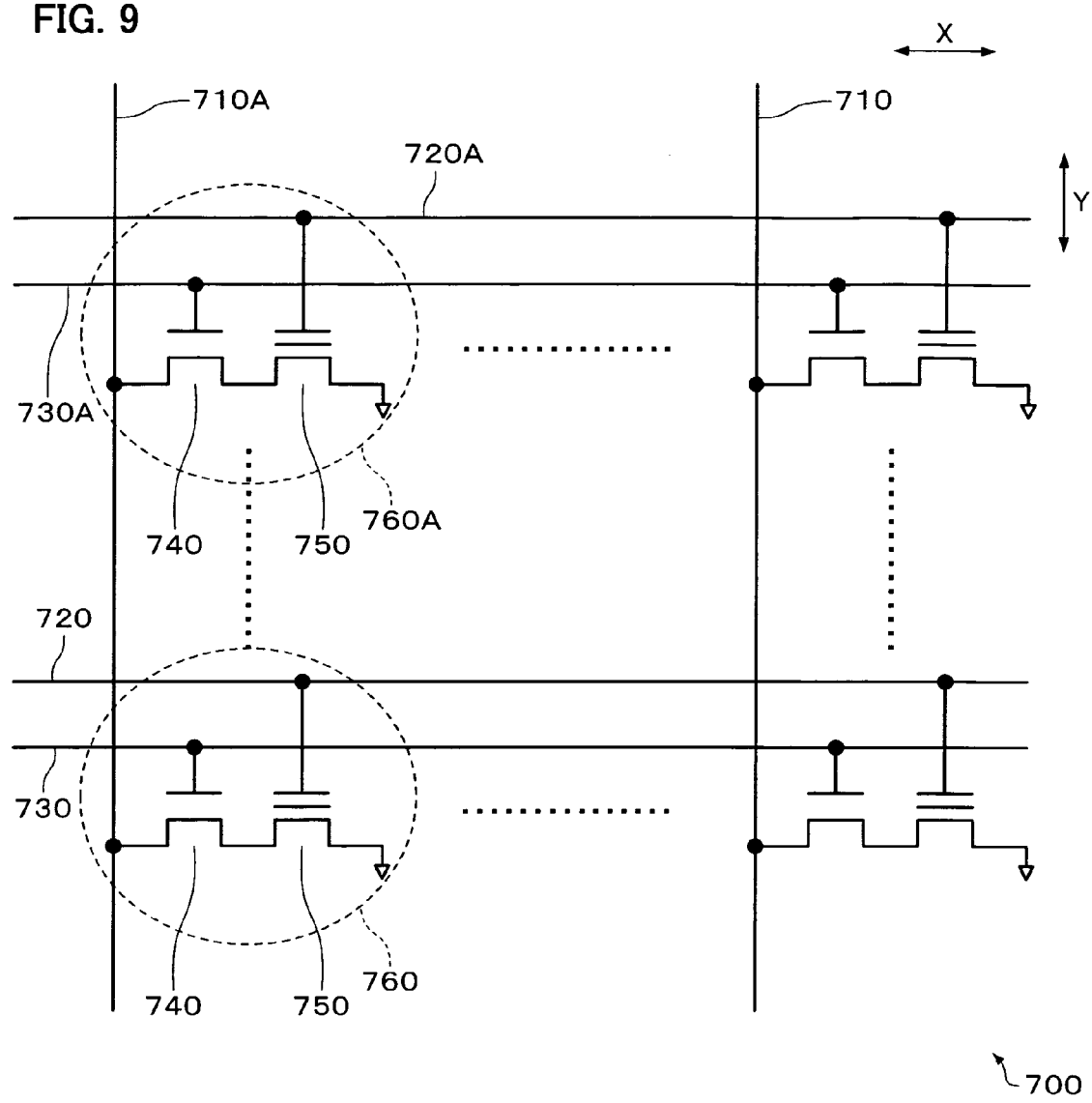
FIG. 9 is a circuit diagram showing a memory cell array according to a comparative example of one embodiment of the invention.

FIG. 9 is a circuit diagram showing a memory cell array 700 in a comparative example according to this embodiment. The memory cell array 700 includes a plurality of bitlines 710, a plurality of control gate lines 720, a plurality of wordlines 730, and a plurality of memory cells 760. However, the invention is not limited thereto. The memory cell array 700 may be configured to exclude the wordlines 730, for example. The memory cell 760 includes a select transistor 740 and a nonvolatile memory element 750. However, the invention is not limited thereto. The memory cell 760 may be configured to exclude the select transistor 740. In the memory cell array 700, M×N memory cells 760 are arranged along the row direction X, for example.

When writing data into the memory cell 760A, the wordline select voltage is applied to the wordline 730A, the control gate line write voltage is applied to the control gate line 720A, and the bitline write voltage is applied to the bitline 710A, for example. This causes the select transistor 740 of the memory cell 760A to be turned ON, whereby data is written into the memory cell 760A.

The control gate line 720A supplies the control gate line write voltage to the M×N memory cells 760. The capacitance of the gate electrodes and the capacitance of the interconnects are increased as the number of memory cells 760 to be connected is increased, whereby power consumption is increased when writing data. Moreover, since an unnecessary voltage is applied to the memory cells 760 in which data is not written, deterioration of the nonvolatile memory elements 750 or erroneous writing or erasing of data may occur.

On the other hand, the nonvolatile memory device 1000 in this embodiment can solve the above-described problems. In the nonvolatile memory device 1000 in this embodiment, when writing data into the selected memory cell block A1 shown in FIG. 4, the control gate line write voltage is supplied to the first control gate line CG11 in the selected memory cell block A1 and the second control gate line CGL1, and the control gate line unselect voltage is supplied to the first control gate lines CG12 to CGxN and the second control gate lines CGL2 to CGLN instead of the control gate line write voltage.

This prevents the control gate line write voltage from being applied to the control gates CGT of the nonvolatile memory elements 310 in the memory cell blocks other than the selected memory cell block A1, whereby power consumption can be reduced and deterioration of the nonvolatile memory element 310 can be prevented.

In the nonvolatile memory device 1000 in this embodiment, since the second control gate switches CGG21 to CGGxN are turned ON when writing data into the selected memory cell block A1 shown in FIG. 4, the first control gate lines CG21 to CGxN connected with the memory cells 300 in the unselected memory cell blocks (e.g. memory cell blocks A2 and A4) arranged in a row differing from the row of the selected memory cell block A1 are set at a ground level. Specifically, since the voltage applied to the control gates CGT of the nonvolatile memory elements 310 in the memory cell blocks (e.g. memory cell blocks A2 and A4) arranged in a row differing from the row of the selected memory cell block A1 can be set at a ground level when writing data, erroneous writing or the like can be prevented.

In the nonvolatile memory device 1000 in this embodiment, since the bitline write voltage and the control gate line write voltage are not supplied to the memory cells 300 in the memory cell blocks other than the selected memory cell block (e.g. selected memory cell block A1), erroneous writing or erasing of the unselected memory cells can be prevented when writing data.

Since a non-active signal (e.g. low-level signal or voltage of 0 V) is supplied to the program signal line PRG when reading data, a ground-level voltage (control gate line unselect voltage in a broad sense) is supplied to the second control gate lines CGL1 to CGLN from each control gate line level shifter 201. Specifically, since the control line select voltage is not applied to the control gate CGT of each memory cell 300 when reading data, deterioration of the memory cells 300 can be prevented, and power consumption can be reduced.

4. Electro-Optical Device

Figure 10:
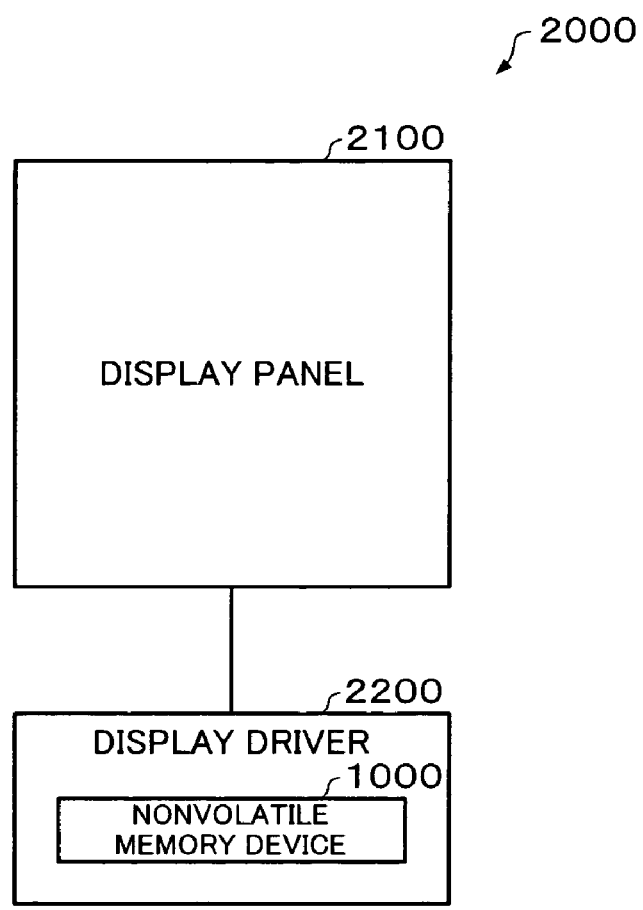
FIG. 10 is a block diagram showing an electro-optical device including a nonvolatile memory device according to one embodiment of the invention.

FIG. 10 is a block diagram showing an electro-optical device 2000 including the nonvolatile memory device 1000. The electro-optical device 2000 includes a display panel 2100 and a display driver 2200 which drives the display panel 2100. The display driver 2200 includes the nonvolatile memory device 1000.

Since initial setting information for driving the display panel 2100 can be stored in the nonvolatile memory device 1000 by providing the nonvolatile memory device 1000 to the display driver 2200, initial setting information optimum for the display panel 2100 and the display driver 2200 can be set in advance. This enables the user to use the electro-optical device 2000 in which the initial setting information on the display panel 2100 and the display driver 2200 is optimally set without performing a complicated setting operation.

In the case where the initial setting information or the like is stored in the nonvolatile memory device 1000 used in the display driver 2200, a nonvolatile memory element which allows only several times of initial writing may be used. In this case, if an unnecessary voltage is applied to the unselected memory cell, the nonvolatile memory element easily deteriorates. The nonvolatile memory device 1000 in this embodiment exerts the above-described effect of preventing deterioration of the nonvolatile memory element on such a nonvolatile memory element with a limited number of writing (e.g. One-Time-PROM).

The single-layer polysilicon type nonvolatile memory element 310 is used for the memory cell 300 of the nonvolatile memory device 1000 as an example. The deposition step of the single-layer polysilicon type memory element is suitable for manufacturing the display driver 2200 in comparison with a stacked type memory element. Since the stacked type memory element is formed by stacking semiconductor layers, manufacturing cost is increased if the stacked type memory element is incorporated into the display driver 2200. Specifically, the display driver 2200 using the nonvolatile memory device 1000 including the single-layer polysilicon type nonvolatile memory element 310 enables a reduction of manufacturing cost.

The single-layer polysilicon type nonvolatile memory element is not suitable for an increase in capacity per unit area, since it is difficult to reduce the size of the single-layer polysilicon type nonvolatile memory element in comparison with the stacked type memory element. Moreover, power consumption may be greater than that of the stacked type memory element. However, since the nonvolatile memory device 1000 in this embodiment can prevent application of an unnecessary voltage to the unselected memory cells, power consumption can be reduced. Therefore, an increase in power consumption can be prevented even if the single-layer polysilicon type nonvolatile memory element is used in the nonvolatile memory device 1000 in this embodiment.

The invention is not limited to the above-described embodiment, and various modifications and variations may be made. For example, the terms (wordline write voltage, bitline write voltage, control gate line write voltage, wordline unselect voltage, bitline unselect voltage, control gate line unselect voltage, etc.) cited in the description in the specification or the drawings as the terms in a broad sense or in a similar sense (8 V, 8 V, 8 V, ground-level voltage, ground-level voltage, ground-level voltage, etc.) may be replaced by the terms in a broad sense or a similar sense in another description in the specification or the drawings.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A nonvolatile memory device, comprising:
   a plurality of memory cell blocks, N memory cell blocks (N is an integer equal to or greater than 2) of the plurality of memory cell blocks being arranged in a row direction, L memory cell blocks (L is an integer equal to or greater than 2) of the plurality of memory cell blocks being arranged in a column direction, and each of the plurality of memory cell blocks including M memory cells (M is an integer equal to or greater than 2);
   a plurality of wordlines;
   a plurality of first control gate lines;
   a plurality of first control gate switches;
   a plurality of second control gate lines;
   a plurality of second control gate switches; and
   a plurality of bitlines,
   wherein each of the M memory cells includes one nonvolatile memory element and one wordline switch, one end of the nonvolatile memory element being connected to one end of the one wordline switch;
   wherein each of the plurality of wordlines connects in common gate electrodes of wordline switches of the memory cells in the N memory cell blocks arranged in the row direction;
   wherein each of the plurality of bitlines connects in common other ends of the plurality of wordline switches of the L memory cells arranged in the column direction;
   wherein one of the plurality of first control gate lines is disposed in each of the plurality of memory cell blocks and connects in common control gate electrodes of the nonvolatile memory elements of the M memory cells;
   wherein each of the plurality of first control gate switches is disposed in each of the plurality of memory cell blocks and one end of one of the plurality of first control gate switches in each of the plurality of memory cell blocks is connected to one of the plurality of first control gate lines in each of the plurality of memory cell blocks;
   wherein each of the plurality of second control gate lines connects in common other ends of the plurality of first control gate switches respectively connected to the L memory cell blocks arranged in the column direction; and
   wherein, when writing data into the memory cells in a selected memory cell block selected from among the plurality of memory cell blocks, the wordline switches of the memory cells in the selected memory cell block are turned ON by applying a wordline write voltage to wordlines connected to the memory cells in the selected memory cell block, a bitline write voltage is applied to bitlines connected to the memory cells in the selected memory cell block, and a control gate line write voltage is applied to one of the plurality of first control gate lines disposed in the selected memory cell block;
   wherein one end of one of the plurality of second control gate switches which is ON/OFF-controlled through the plurality of wordlines is connected to one of the plurality of first control gate lines;
   wherein another end of one of the plurality of second control gate switches is grounded; and
   wherein, when writing data into the memory cells in the selected memory cell block,
   one of the plurality of second control gate switches connected to one of the first control gate lines disposed in the selected memory cell block is turned OFF, and
   a wordline unselect voltage is applied to wordlines not connected to the selected memory cell block so that one of the plurality of second control gate switches connected to one of the plurality of first control gate lines disposed in one of the plurality of memory cell blocks connected to the wordlines to which the wordline unselect voltage is applied is turned ON, thereby causing one of the plurality of first control gate lines disposed in one of the plurality of memory cell blocks disposed in a row other than a row of the selected memory cell block to be grounded.

2. The nonvolatile memory device as defined in claim 1, further comprising:
   a Y-decoder which outputs a plurality of bitline select signals; and
   M×N bitline switches, each of which is ON/OFF-controlled by one of the bitline select signals,
   wherein M bitlines among the plurality of bitlines are connected to each of the N memory cell blocks arranged in the row direction;
   wherein one end of each of M bitline switches among the M×N bitline switches is connected to one of the M bitlines, and another end of each of the M bitline switches is connected to one of M signal lines of a data bus; and
   wherein, when writing data into the memory cells in the selected memory cell block,
   the bitline write voltage or a ground-level voltage is supplied to the M signal lines of the data bus,
   the Y-decoder sets the bitline select signals for controlling the bitline switches active so that the bitline switches are turned ON, the bitline switches being connected to the M bitlines for the selected memory cell block, and
   the bitline write voltage or the ground-level voltage is applied to the bitlines connected to the memory cells in the selected memory cell block by supplying the voltages applied to the signal lines of the data bus to the M bitlines for the selected memory cell block.

3. The nonvolatile memory device as defined in claim 2,
   wherein the plurality of first control gate switches are ON/OFF-controlled through the plurality of wordlines; and
   wherein, when writing data into the memory cells in the selected memory cell block,
   the control gate line write voltage is applied to one of the plurality of second control gate lines connected to one of the plurality of first control gate switches which is connected to one of the plurality of first control gate lines disposed in the selected memory cell block,
   a control gate line unselect voltage is applied to one of the plurality of second control gate lines which is not connected to one of the plurality of first control gate switches which is connected to one of the plurality of first control gate lines disposed in the selected memory cell block, and one of the plurality of first control gate switches connected to one of the plurality of first control gate lines disposed in the selected memory cell block is turned ON by applying the wordline write voltage to the wordlines connected to the selected memory cell block, thereby supplying the control gate line write voltage to one of the plurally of first control gate lines disposed in the selected memory cell block.

4. The nonvolatile memory device as defined in claim 3, wherein the control gate line write voltage is supplied to the plurally of second control gate lines based on the bitline select signals; and wherein, when writing data into the memory cells in the selected memory cell block, the control gate line write voltage is applied to one of the plurality of second control gate lines connected to one of the plurality of first control gate switches which is connected to one of the plurality of first control gate lines disposed in the selected memory cell block based on the bitline select signals set to active, and the control gate line unselect voltage is applied to one of the plurality of second control gate lines which is not connected to one of the plurality of first control gate switches corresponding to the selected memory cell block when the bitline select signals are set to non-active.

5. A data write method for a nonvolatile memory device, comprising:

providing a plurality of memory cell blocks, N memory cell blocks (N is an integer equal to or greater than 2) of the plurality of memory cell blocks being arranged in a row direction, L memory cell blocks (L is an integer equal to or greater than 2) of the plurality of memory cell blocks being arranged in a column direction, and each of the plurality of memory cell blocks including M memory cells (M is an integer equal to or greater than 2);

providing a plurality of wordlines, each of which connects in common gate electrodes of wordline switches of M×N memory cells arranged in a row direction among memory cells, each of the memory cells including one nonvolatile memory element and one wordline switch, one end of the nonvolatile memory element being connected to one end of the one wordline switch;

providing a plurality of first control gate lines, each of which is disposed in each of the plurality of memory cell blocks and connects in common control gate electrodes of the nonvolatile memory elements of the M memory cells;

providing a plurality of first control gate switches;
providing a plurality of second control gate lines;
providing a plurality of second control gate switches; and
providing a plurality of bitlines, each of which connects in common other ends of the wordline switches of the L memory cells arranged in the column direction, wherein each of the plurality of first control gate switches is disposed in each of the plurality of memory cell blocks and one end of the first control gate switch in each of the plurality of memory cell blocks is connected to the first control gate line in each of the plurality of memory cell blocks;

wherein each of the plurality of second control gate lines connects in common other ends of first control gate switches respectively connected to the L memory cell blocks arranged in the column direction; and wherein, when writing data into memory cells in a selected memory cell block selected from among the plurality of memory cell blocks, turning ON wordline switches of the memory cells in the selected memory cell block by applying a wordline write voltage to wordlines connected to the memory cells in the selected memory cell block, applying a bitline write voltage to bitlines connected to the memory cells in the selected memory cell block, and applying a control gate line write voltage to one of the plurality of first control gate lines disposed in the selected memory cell block, wherein, when writing data into the memory cells in the selected memory cell block, turning OFF each of the plurality of second control gate switches connected to one of the plurality of first control gate lines disposed in the selected memory cell block, and applying a wordline unselect voltage to wordlines not connected to the selected memory cell block so that one of the plurality of second control gate switches connected to one of the plurality of first control gate lines disposed in one of the plurality of memory cell blocks connected to the wordlines to which the wordline unselect voltage is applied is turned ON, thereby causing one of the plurality of first control gate lines disposed in one of the plurality memory cell blocks disposed in a row other than a row of the selected memory cell block to be grounded.

6. The data write method for a nonvolatile memory device as defined in claim 5, wherein, when writing data into the memory cells in the selected memory cell block, supplying the bitline write voltage or a ground-level voltage to signal lines of a data bus, one end of each of M bitline switches being connected to one of M bitlines among the plurality of bitlines, and another end of each of the M bitline switches being connected to one of the signal lines of the data bus, setting to active bitline select signals for controlling the M bitline switches connected to part of the plurality of bitlines connected to the memory cells in the selected memory cell block so that the M bitline switches are turned ON, and applying the bitline write voltage or the ground-level voltage to part of the plurality of bitlines connected to the memory cells in the selected memory cell block by supplying the voltages applied to the signal lines of the data bus to the M bitlines for the selected memory cell block.

7. The data write method for a nonvolatile memory device as defined in claim 6, wherein, when writing data into the memory cells in the selected memory cell block, applying the control gate line write voltage to one of the plurality of second control gate lines connected to one of the plurality of first control gate switches which is connected to one of the plurality of first control gate lines disposed in the selected memory cell block, applying a control gate line unselect voltage to one of the plurality of second control gate lines which is not connected to one of the plurality of first control gate switches which is connected to one of the plurality of first control gate lines disposed in the selected memory cell block, and turning ON one of the plurality of first control gate switches connected to one of the plurality of first control gate lines disposed in the selected memory cell block by applying the wordline write voltage to the plurality of wordlines connected to the selected memory cell block, thereby supplying the control gate line write voltage to one of the plurality of first control gate lines disposed in the selected memory cell block.

8. The data write method for a nonvolatile memory device as defined in claim 7, wherein, when writing data into the memory cells in the selected memory cell block, applying the control gate line write voltage to one of the plurality of second control gate lines connected to one of the plurality of first control gate switches which is connected to one of the plurality of first control gate lines disposed in the selected memory cell block based on the bitline select signals set to active, and applying the control gate line unselect voltage to one of the plurality of second control gate lines which is not connected to one of the plurality of first control gate switches corresponding to the selected memory cell block when the bitline select signals are set to non-active.

* * * * *